United States Patent
Li et al.

(10) Patent No.: US 10,204,936 B2
(45) Date of Patent: Feb. 12, 2019

(54) ARRAY SUBSTRATE AND METHOD FOR MANUFACTURING THE SAME, DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Tiansheng Li, Beijing (CN); Jian Guo, Beijing (CN); Zhenyu Xie, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/405,008

(22) PCT Filed: Nov. 20, 2013

(86) PCT No.: PCT/CN2013/087524
§ 371 (c)(1),
(2) Date: Dec. 2, 2014

(87) PCT Pub. No.: WO2015/010397
PCT Pub. Date: Jan. 29, 2015

(65) Prior Publication Data
US 2015/0318313 A1 Nov. 5, 2015

(30) Foreign Application Priority Data
Jul. 23, 2013 (CN) .......................... 2013 1 0310000

(51) Int. Cl.
*H01L 27/12* (2006.01)
*H01L 27/15* (2006.01)

(52) U.S. Cl.
CPC ........ *H01L 27/1251* (2013.01); *H01L 27/124* (2013.01); *H01L 27/127* (2013.01); *H01L 27/1288* (2013.01); *H01L 27/15* (2013.01)

(58) Field of Classification Search
CPC .......................... H01L 27/124; H01L 27/1244
(Continued)

(56) References Cited

U.S. PATENT DOCUMENTS 4,960,719 A * 10/1990 Tanaka ................ H01L 27/1214
257/347
6,448,579 B1 * 9/2002 Lim ........................ H01L 29/04
257/59
(Continued)

FOREIGN PATENT DOCUMENTS

CN 101030560 A 9/2007
CN 101656232 A 2/2010
(Continued)

OTHER PUBLICATIONS

International Search Report, International Preliminary Report on Patentability and Written Opinion of the International Searching Authority of PCT/CN2013/087524 in Chinese, dated Jun. 18, 2014.
(Continued)

*Primary Examiner* — Meiya Li
*Assistant Examiner* — Peter M Albrecht
(74) *Attorney, Agent, or Firm* — Collard & Roe, P.C.

(57) ABSTRACT

An array substrate includes a display region and a Gate driver On Array (GOA) region. In the GOA region, a gate metal electrode, a gate insulating layer, an active layer, a transition layer, and a source-drain metal electrode are formed in sequence from bottom to top, and a via hole is
(Continued)

provided penetrating the transition layer, the active layer and the gate insulating layer, the source-drain metal electrode is electrically connected to the gate metal electrode through the via hole; and at an edge of the via hole, there is formed an angle opening upward at edges of the transition layer and the active layer. There are further disclosed a manufacturing method of the array substrate and a display device provided with the array substrate.

12 Claims, 4 Drawing Sheets

(58) Field of Classification Search
USPC .......................................................... 257/72
See application file for complete search history.

(56) References Cited

U.S. PATENT DOCUMENTS

| | | | |
|---|---|---|---|
| 8,685,803 B2* | 4/2014 | Chikama | H01L 27/1248 |
| | | | 257/258 |
| 2002/0132385 A1* | 9/2002 | Dojo | H01L 27/1214 |
| | | | 438/30 |
| 2008/0135845 A1* | 6/2008 | Heo | H01L 27/1288 |
| | | | 257/59 |
| 2008/0299777 A1* | 12/2008 | Tosaka | H01L 21/31116 |
| | | | 438/724 |
| 2010/0207122 A1* | 8/2010 | Oh | G02F 1/13458 |
| | | | 257/59 |
| 2011/0122054 A1 | 5/2011 | Shimzu et al. | |
| 2012/0007084 A1* | 1/2012 | Park | H01L 27/1225 |
| | | | 257/59 |

FOREIGN PATENT DOCUMENTS

| | | | |
|---|---|---|---|
| JP | 06267906 A | * | 9/1994 |
| WO | 2010/018728 A1 | | 2/2010 |

OTHER PUBLICATIONS

English translation of the International Preliminary Report on Patentability and Written Opinion of the International Searching Authority of PCT/CN2013/087524, dated Jan. 26, 2016.
English Translation of the International Search Report of PCT/CN2013/087524 published in English dated Jan. 29, 2015.
Chinese Office Action of Chinese Application No. 201310310000.7, dated Apr. 22, 2015 with English translation.

* cited by examiner

ARRAY SUBSTRATE AND METHOD FOR MANUFACTURING THE SAME, DISPLAY DEVICE

CROSS REFERENCE TO RELATED APPLICATIONS

This application is the National Stage of PCT/CN2013/087524 filed on Nov. 20, 2013, which claims priority under 35 U.S.C. § 119 of Chinese Application No. 201310310000.7 filed on Jul. 23, 2013, the disclosure of which is incorporated by reference.

TECHNICAL FIELD

Embodiments of the present invention relate to an array substrate and a method for manufacturing the same, and a display device provided with the array substrate.

BACKGROUND

With the continuing development of display technology, thin film transistor liquid crystal displays (TFT-LCDs) are playing a leading role in the field of flat panel display. A Gate driver on array (GOA) technology is applied in more and more TFT-LCDs, namely, a GOA region is defined at the edge of an array substrate, a gate metal electrode and a source-drain metal electrode provided in the GOA region are electrically connected through a via hole penetrating a gate insulating layer and an active layer, and act as a part of a gate drive circuit, so as to achieve a display panel with a higher pixel intensity (Pixel Per Inch, PPI). Moreover, in order to reduce the use number of mask during manufacture of the array substrate, the via hole penetrating the gate insulating layer and the active layer is usually formed in the GOA region by using one masking process. For example, during manufacture of an Advanced super Dimension Switch (ADS) mode array substrate, an active layer and a gate insulating layer are etched in a GOA region with the same masking process so as to form a via hole therein, so that the array substrate can be formed only through six masking processes.

SUMMARY

According to embodiments of the present invention, there are provided an array substrate and a manufacturing method thereof, and a display device provided with the array substrate, so as to increase the stability of electrical connection between a source-drain metal electrode and a gate metal electrode that are disposed in a GOA region.

In an aspect of the invention, there is provided an array substrate, comprising a display region and a GOA region, wherein in the GOA region, a gate metal electrode, a gate insulating layer, an active layer, a transition layer, and a source-drain metal electrode are formed in sequence from bottom to top, and a via hole is provided penetrating the transition layer, the active layer and the gate insulating layer, the source-drain metal electrode is electrically connected to the gate metal electrode through the via hole; at an edge of the via hole, there is formed an angle opening upward at edges of the transition layer and the active layer.

For example, in the array substrate, a material for the transition layer may be silicon nitride.

For example, in the array substrate, in the display region, there is provided a thin film transistor, which comprises a gate electrode, a gate insulating layer, an active layer, and source and drain electrodes in sequence from bottom to top.

For example, in the array substrate, during etch of the transition layer, the gate insulating layer and the active layer, an etching rate of the transition layer is larger than the an etching rate of the active layer.

In another aspect of the invention, there is further provided a manufacturing method of an array substrate, comprising: forming a gate metal electrode in a GOA region and a gate line and a gate electrode in a display region on a base substrate; depositing a gate insulating layer, an active layer and a transition layer in sequence on the base substrate, an etching rate of the transition layer being larger than an etching rate of the active layer; etching off the transition layer, the active layer and the gate insulating layer in the GOA region, as well as the transition layer and part of the active layer in a thin film transistor region in the display region, and forming a via hole in the GOA region; forming a source-drain metal electrode in the GOA region, and meanwhile forming a data line, a source electrode and a drain electrode in the display region, wherein the source-drain metal electrode is electrically connected to the gate metal electrode through the via hole.

For example, in the method, forming the via hole in the GOA region comprises: forming a photoresist pattern that comprises a fully-removed region, a partially-retained region and a fully-retained region on the transition layer; the fully-removed region corresponds to the region where the gate metal electrode is located, the partially-retained region corresponds to the thin film transistor region in the display region; etching off the transition layer, the active layer and the gate insulating layer in the fully-removed region, so as to form the via hole; removing the photoresist in the partially-retained region and decreasing a thickness of the photoresist in the fully-retained region through an ashing process; etching off the transition layer and part of the active layer in the partially-retained region; removing the photoresist in the fully-retained region through an ashing process.

For example, after the source-drain metal electrode is formed in the GOA region and meanwhile the data line, the source electrode and the drain electrode are formed in the display region, the method may further comprise that a pixel electrode electrically connected to the drain electrode is formed on the base substrate, and a protective layer is formed on the base substrate.

For example, after the protective layer is formed on the base substrate, the method may further comprise that a common electrode is formed on the protective layer.

In still another aspect of the invention, there is further provided a display device, comprising the array substrate as stated above.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

Unless otherwise defined, the technical terminology or scientific terminology used herein should have the same meaning as commonly understood by one of ordinary skill in the art to which this invention belongs. "First", "second" and the like used in the present disclosure do not show any order, number or importance, but are only used to distinguish different constituent parts. Likewise, a term "a," "an," or the like does not indicate limitation in number, but specifies the presence of at least one. A term "comprises," "comprising," "includes," "including", or the like means that an element or article ahead of this term encompasses element(s) or article(s) listed behind this term and its(their) equivalents, but does not preclude the presence of other elements or articles. A term "connection," "connected," or the like is not limited to physical or mechanical connection, but can include electrical connection, whether directly or indirectly. "Upper," "lower," "left," "right" or the like is only used to describe a relative positional relationship, and when an absolute position of the described object is changed, the relative positional relationship might also be changed accordingly.

Figure 1:
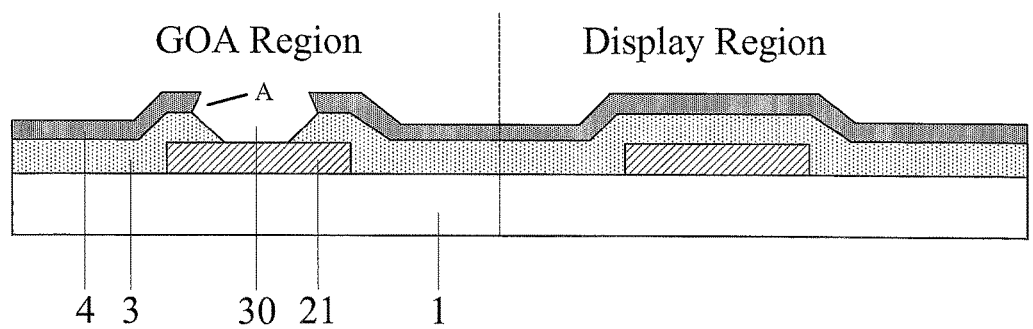
FIG. 1 is a schematic view illustrating a conventional array substrate.

It has been found by inventors of the invention that the traditional GOA technology has at least the following problems. FIG. 1 is a schematic view illustrating a conventional array substrate, in which the left half of a base substrate 1 is a GOA region and the right half of it is a display region. In general, the display region is located in the middle portion of the array substrate, and comprises an array of pixels, each of which comprises, for example, a drive circuit for a TFT that comprises a gate electrode, a gate insulating layer, an active layer, source and drain electrodes, etc.; and the GOA region is located in a side area of the array substrate. As shown in FIG. 1, in the GOA region, for example, a gate metal electrode 21, a gate insulating layer 3 and an active layer 4 are sequentially formed on the base substrate 1, and the active layer 4 is usually composed of two layers, i.e., a metal heavily-doped layer in the upper level and an amorphous silicon layer in the lower level. During etch of a via hole 30, the etching rate of the metal heavily doped layer in the upper level is far slower than the etching rate of the amorphous silicon layer in the lower level, and so, when the gate insulating layer 3 and the active layer 4 are etched off fully to form the via hole 30, a chamfer opening downward (as denoted by "A" in FIG. 1) may be formed at an edge of the active layer 4. The chamfer will give rise to a space existing underneath a source-drain metal electrode deposited subsequently, thereby affecting the stability of electrical connection between the source-drain metal electrode and the gate metal electrode in the GOA region.

Figure 2:
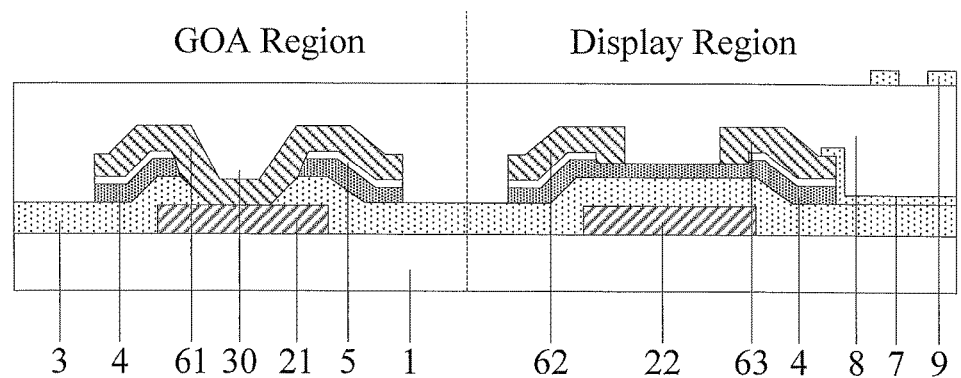
FIG. 2 is a schematic view illustrating an array substrate provided by an embodiment of the invention.

An array substrate is provided by an embodiment of the invention. As shown in FIG. 2, the array substrate provided by the embodiment of the invention comprises a display region and a GOA region. For example, the display region is located in the middle portion of the array substrate and comprises a plurality of gate lines and a plurality of data lines, and these gate lines and data lines cross over each other to thereby define pixels arranged in the form of a matrix, each of which comprises a thin film transistor (TFT) that functions as a switch element and comprises a gate electrode, a gate insulating layer, an active layer, source and drain electrode, etc.; the GOA region is located in a side area of the array substrate, is configured for providing a gate signal so as to drive the pixel array in the display region.

As shown in FIG. 2, in the GOA region of the array substrate according to the embodiment, a gate metal electrode 21, a gate insulating layer 3, an active layer 4, a transition layer 5, and a source-drain metal electrode 61 are formed sequentially on a base substrate 1 from bottom to top, and a via hole 30 penetrating the transition layer 5, the active layer 4 and the gate insulating layer 3 is formed. The source-drain metal electrode 61 is electrically connected to the gate metal electrode 21 through the via hole 30 so as to serve as a part of a gate drive circuit.

The transition layer 5 may adopt a variety of insulating materials, as long as the etching rate of the transition layer 5 is larger than the etching rate of the active layer 4 in an etching process in which the via hole 30 for electrically connecting the source-drain metal electrode 61 and the gate metal electrode 21 is formed subsequently. The base substrate 1 is for example a glass substrate, a quartz substrate, a plastic substrate or the like. The active layer is for example an amorphous silicon semiconductor layer, an oxide semiconductor layer or the like, and the oxide semiconductor layer is for example a indium zinc oxide layer, a doped IZO layer (e.g. an IGZO layer) or the like. The material for the transition layer 5 is preferably for example silicon nitride (SiNx).

Because the transition layer 5 is provided on the active layer 4, it is necessary to etch the transition layer 5, the active layer 4 and the gate insulating layer 3 in sequence when the via hole 30 is formed in the GOA region by etching. Because the etching rate of the transition layer 5 is larger than the etching rate of the active layer 4 in this etching process, the transition layer 5 will be etched off to a greater degree as compared to the active layer 4 after the etching for the via hole 30 is completed. Consequently, an angle that opens upward (as denoted by B in FIG. 3g) is formed at edges of both the transition layer 5 and the active layer 4, and results in a notch that is wider at the top while narrower at the bottom as shown in the drawing, and each of the inclined faces of the transition layer and the active layer at the edge makes an acute angle of 15 to 70 degrees with respect to the horizontal bottom surface. With the help of this structure, the stability of electrical connection between the source-drain metal electrode 61 and the gate metal electrode 21 that are formed subsequently in the GOA region is enhanced.

The TFT region in the display region of the array substrate, as shown in FIG. 2, from bottom to top, comprises in sequence a gate electrode 22, the gate insulating layer 3, the active layer 4, a source electrode 62 and a drain electrode 63 that are formed on the base substrate 1, and the source electrode 62 and the drain electrode 63 are located on two sides of the active layer 4, respectively, and are connected, such as in direct contact, with the active layer 4. The section of the active layer 4 between the source electrode 62 and the drain electrode 63 can become conductive in operation and is converted to be a channel. Furthermore, a pixel of the display region further comprises a pixel electrode 7, and a protective layer 8 may be further included on the GOA region and the display region.

The array substrate provided by the above embodiment of the invention is an ADS mode array substrate, and thus a common electrode 9 is also included in the display region. For example, the pixel electrode 7 may be a plate-like electrode or a slit electrode (e.g. a comb-like electrode), and the common electrode may be a slit electrode (e.g. a comb-like electrode).

Certainly, in other embodiments, the array substrate may also be an array substrate of other type than ADS, such as vertical alignment (VA) type, in-plane switching (IPS) type, fringe field switching (FFS) type, or the like.

According to another embodiment of the invention, there is further provided a manufacturing method of the above-mentioned array substrate, comprising the process as illustrated below.

Figure 3A:
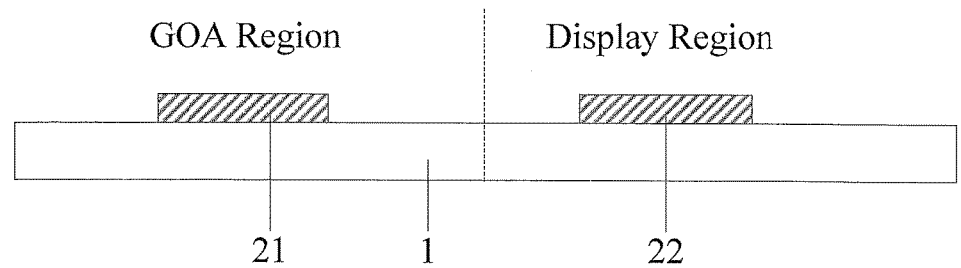
FIGS. 3a to 3j are schematic views illustrating the manufacturing process of a manufacturing method of an array substrate provided by an embodiment of the invention.

S1: as shown in FIG. 3a, a gate metal electrode 21 in a GOA region and a gate line (not shown in the figure) and a gate electrode 22 in a display region are formed on a base substrate 1.

A gate metal layer is deposited (e.g. sputtered) on a base substrate, and then by use of a masking process, the gate metal layer can be patterned into the gate metal electrode 21 in the GOA region and the gate line (not shown) and the gate electrode 22 in the display region through development and etching. As for each pixel, a gate line and a gate electrode are electrically connected to each other in correspondence, or part of the gate line acts as the gate electrode.

Figure 3B:
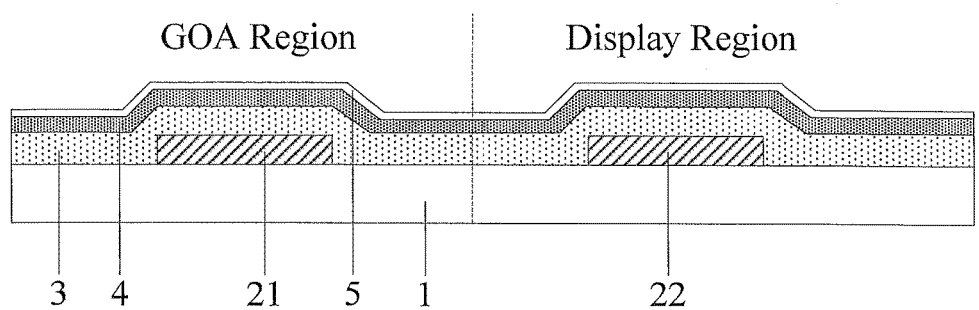

S2: as shown in FIG. 3b, a gate insulating layer 3, an active layer 4 and a transition layer 5 are deposited on the base substrate 1 in sequence. Here, materials are selected so that the etching rate of the transition layer 5 is larger than the etching rate of the active layer 4 in a subsequent etch process for manufacture of a via hole, and for example, the material for the transition layer 5 is SiNx. The active layer 4 is for example an amorphous silicon semiconductor layer, an oxide semiconductor layer or the like.

S3: the transition layer, the active layer and the gate insulating layer in the GOA region, and the transition layer and part of the active layer at a TFT region in the display region are etched off, so as to form a via hole in the GOA region.

An example of the above process S3 may be as follows.

Figure 3C:
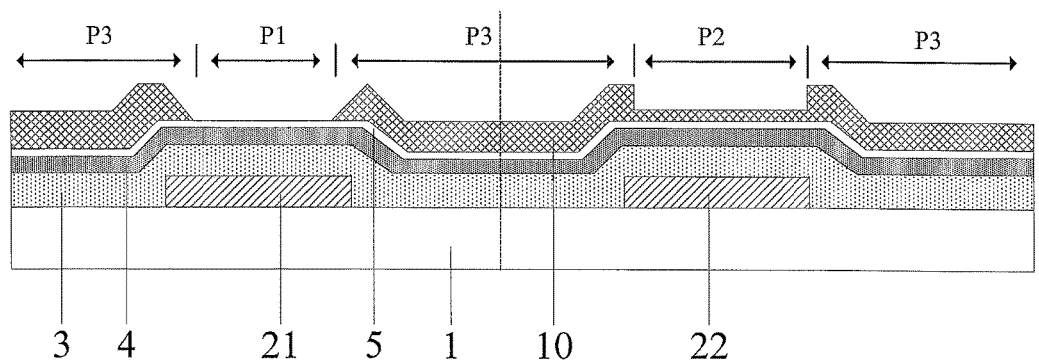

S31: as shown in FIG. 3c, a layer of photoresist 10 is coated on the base substrate 1, and a photoresist pattern formed with the photoresist 10 is obtained by a grey-tone masking process and a dry etch process. The photoresist pattern has a fully-removed region P1, a partially-retained region P2 and fully-retained region P3. The fully-removed region P1 corresponds to the region where the gate metal electrode 21 is located, the partially-retained region P2 corresponds to the TFT region in the display region, and fully-retained region corresponds to the rest region on the base substrate 1.

Figure 3D:
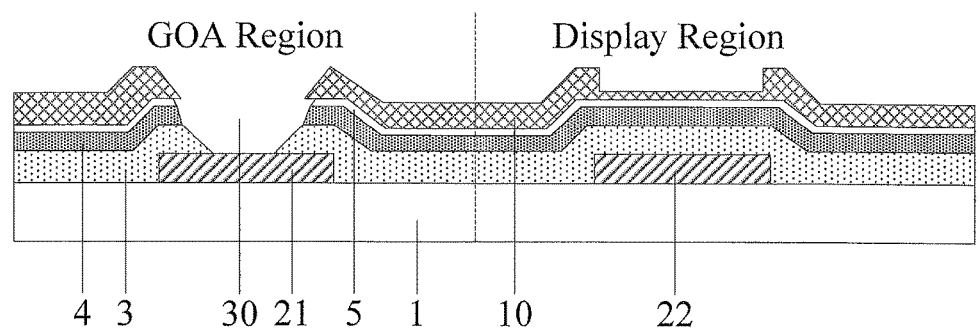

S32: as shown in FIG. 3d, the transition layer 5, the active layer 4 and the gate insulating layer 3 in the fully-remove region are etched off so as to form a via hole 30 in the GOA region. For example, a dry etch process is used for the above etching process.

Figure 3E:
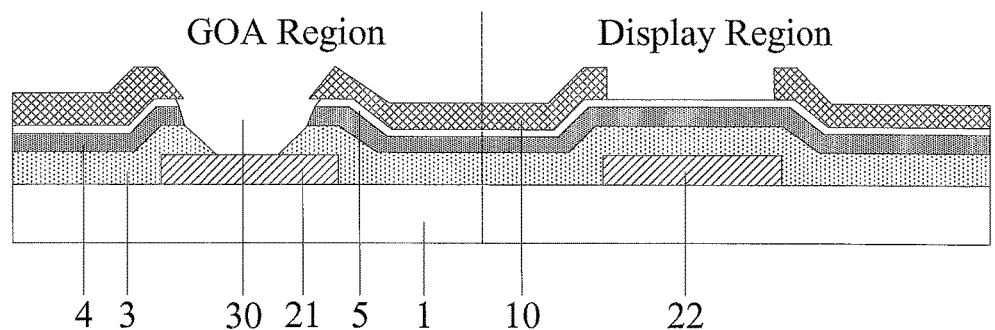

Because the etching rate of the transition layer 5 is larger than the etching rate of the active layer 4 in this etching, a greater part of transition layer 5 will be etched off as compared to the active layer 4 after the etching for the via hole 30 is completed. Consequently, an angle that opens upward is formed at edges of the transition layer 5 and the active layer 4, and this angle results in a notch that is wider at the top while narrower at the bottom as shown in the figure, S33: as shown in FIG. 3e, by an ashing process, the photoresist 10 in the partially-retained region P2 of photoresist is removed, and accordingly, the thickness of photoresist in the fully-retained region P3 is decreased.

Figure 3F:
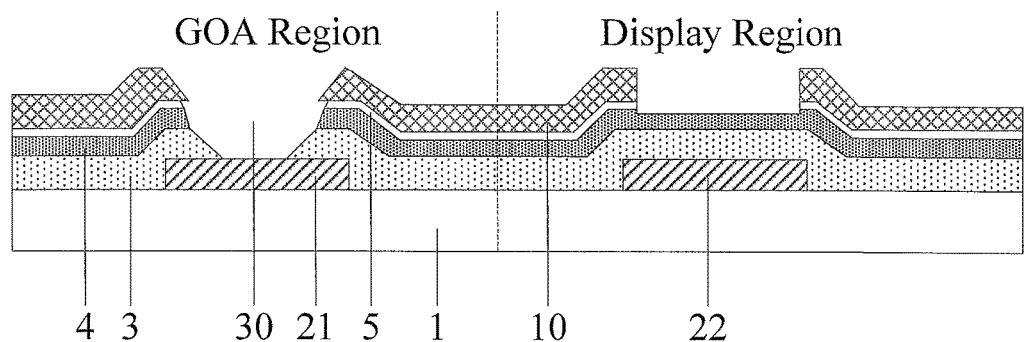

S34: as shown in FIG. 3f, the transition layer 5 and a part of the active layer 4 in the partially-retained region are etched off, so as to define the active layer for each TFT. That is, in the TFT region, an opening 31, through which part of the underlying active layer 4 is exposed, is formed in the transition layer 5, and the active layer 4 is etched in part so as to have a slightly reduced thickness.

Figure 3G:
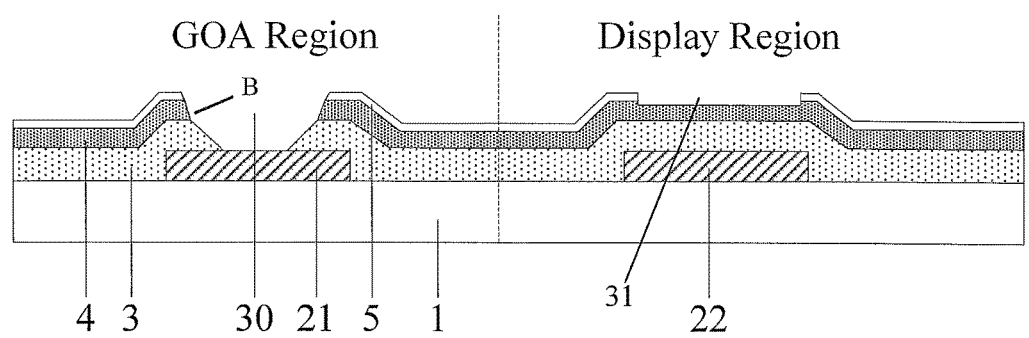

S35: as shown in FIG. 3g, for example, by an ashing process, the remaining photoresist 10 in the fully-retained region is removed.

Figure 3H:
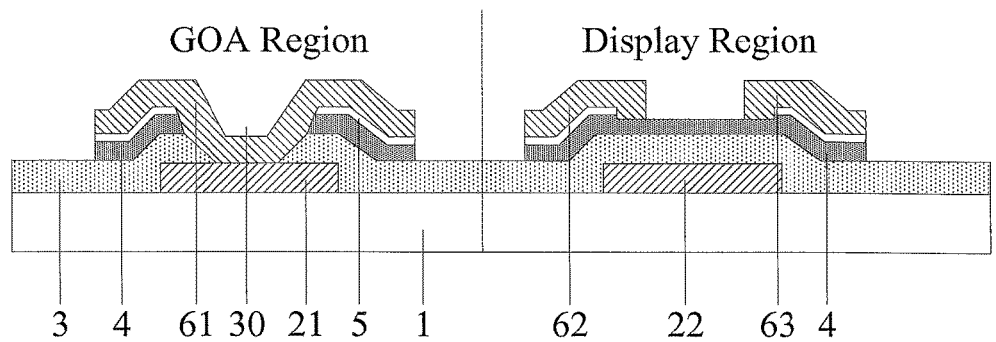

S4: as shown in FIG. 3h, a source-drain metal electrode 61 is formed in the GOA region, and meanwhile, a data line (not shown in the figure), a source electrode 62 and a drain electrode 63 are formed in the display region. In the GOA region, the source-drain metal electrode 61 is electrically connected to the gate metal electrode 21 through the via hole 30.

For example, it is possible that with a conventional method (e.g. sputtering, CVD method or the like), a source-drain metal layer is deposited on the base substrate 1, and then, by means of a masking process, the layer can be patterned into the source-drain metal electrode 61 in the GOA region and the data line, the source electrode 62 and the drain electrode 63 in the display region through development and etching. Further, after the source-drain metal electrode 61, the data line, the source electrode 62 and the drain electrode 63 are formed, the remaining transition layer 5 and active layer 4 that has been exposed outside continue to be etched off further. The source electrode 62 and the drain electrode 63 are at least in part provided in the opening 31 in the transition layer 5 so as to contact with the active layer of a TFT, and are separated from each other in an insulating way in the opening 31 as well. In the active layer of the TFT, the section between the source electrode 62 and the drain electrode 63 can become conductive in operation so as to form a channel.

Because the via hole 30 has been formed in the GOA region previously, the source-drain metal electrode 61 can be electrically connected to the gate metal electrode 21 through the via hole.

The manufacturing method of the array substrate according to the embodiment may further comprise the following processes.

Figure 3I:
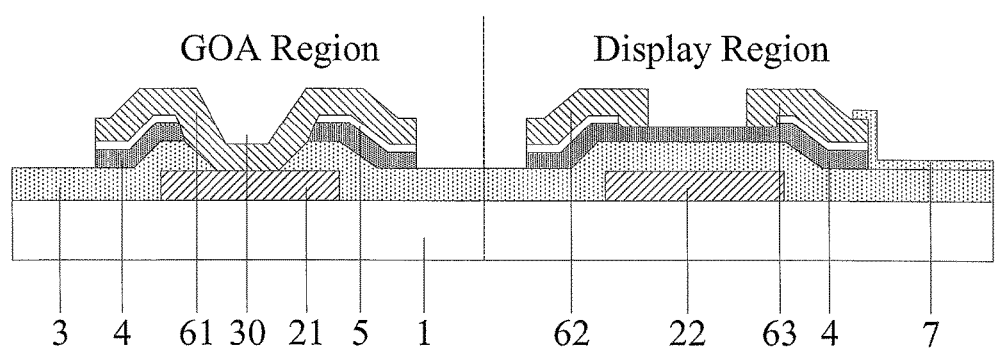

S5: as shown in FIG. 3i, a pixel electrode 7 is formed on the base substrate 1. For example, a transparent conductive layer is deposited on the base substrate 1, and then is patterned so as to form the pixel electrode 7, and for example, the pixel electrode 7 directly contact with the drain electrode 63 of the TFT for electrical connection. The pixel electrode 7 may be for example a plate-like electrode or a slit electrode (e.g. a comb-like electrode).

Figure 3J:
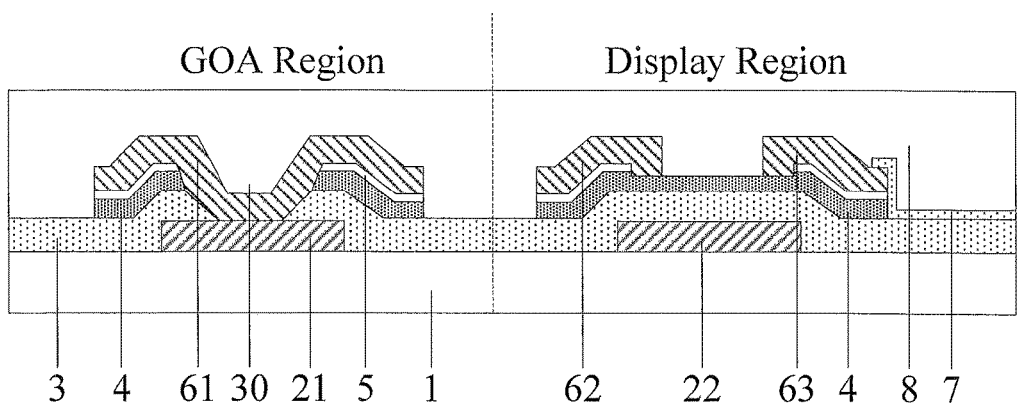

S6: as shown in FIG. 3j, a protective layer 8 is formed on the base substrate 1. The protective layer 8 may be for example an inorganic layer or an organic insulating layer.

The array substrate provided by the embodiment is an ADS mode array substrate, and thus the manufacturing method of the array substrate further comprises the following processes.

S7: a common electrode 9 is formed on the protective layer 8 of the base substrate 1, and thus the array substrate provided by the embodiment of the invention can be formed, as shown in FIG. 2. For example, it is possible that a transparent conductive layer is deposited, and then is patterned to form the common electrode 9. For example, the common electrode 9 corresponds to the pixel electrode 7, and is for example a slit electrode (e.g. a comb-like electrode), and it is applied with a common voltage in operation.

The above steps S5 to S7 each can be implemented by a conventional method, and they will not be described in detail any more.

In the manufacturing method of the array substrate provided by embodiments of the invention, a transition layer is provided on an active layer, and the etching rate of the transition layer is larger than the etching rate of the active layer, so that an angle that opens upward is formed at edges of the transition layer 5 and the active layer 4 after the etching for the via hole is completed. The angle leads to a notch that is larger at the top and is smaller at the bottom as shown in the figure. With this structure, the stability of electrical connection between the source-drain metal electrode and the gate metal electrode in the GOA region is enhanced.

According to an embodiment of the invention, there is provided a display device, which may be a liquid crystal panel, an electronic paper, an OLED panel, a liquid crystal television, a liquid crystal display, a digital photo frame, a cell phone, a tablet computer or any other product or component having display function. The array substrate provided by embodiments of the invention as stated above is included in the display device. The array substrate is disposed in opposition to a counter substrate so as to form a liquid crystal cell, in which a liquid crystal material is filled. The counter substrate is for example a color filter substrate. In some examples, the display device further comprises a backlight source for providing the array substrate with backlight.

Because the display device provided by embodiments of the invention has the same technical features as the array substrate provided by embodiments the invention as stated above, it can also bring about the same technical effects and solve the same technical problems.

Descriptions made above are merely exemplary embodiments of the invention, but are not used to limit the protection scope of the invention. The protection scope of the invention is determined by attached claims.

The invention claimed is:

1. An array substrate, comprising:
a base substrate comprising a display region and a Gate driver On Array (GOA) region at a side of the display region,
wherein in the display region, there is provided a thin film transistor, the thin film transistor comprising:
a gate electrode over the base substrate,
a gate insulating layer over the gate electrode,
an active layer over the gate insulating layer, and
a source electrode and a drain electrode over the active layer;
wherein in the GOA region, there are formed:
a gate metal electrode over the base substrate and in a same first layer as the gate electrode,
the gate insulating layer over the gate metal electrode,
the active layer over the gate insulating layer,
a transition layer over the active layer, and
a source-drain metal electrode over the transition layer and in a same second layer as the source electrode and the drain electrode,
wherein the transition layer is disposed directly over a top surface of the active layer, the transition layer is made of an insulating material, a via hole is provided in the GOA region and penetrating the transition layer, the active layer and the gate insulating layer to expose a portion of the gate metal electrode, the source-drain metal electrode is electrically connected to the gate metal electrode through the via hole; and the via hole is tapered from a top surface of the transition layer to a bottom surface of the active layer, and
wherein the via hole in the GOA region exposes a first sidewall of the active layer and a second sidewall of the insulating material of the transition layer, and the first sidewall is directly connected to the second sidewall.

2. The array substrate claimed as claim 1, wherein the insulating material for the transition layer is silicon nitride.

3. The array substrate claimed as claim 1, wherein during etch of the transition layer, the gate insulating layer and the active layer, an etching rate of the transition layer is larger than an etching rate of the active layer.

4. A manufacturing method of an array substrate, comprising:
providing a base substrate including a display region and a Gate driver On Array (GOA) region at a side of the display region;
forming a gate metal electrode in the GOA region, and a gate electrode in the display region;
depositing a gate insulating layer over the gate metal electrode and the gate electrode,
depositing an active layer over the gate insulating layer, and
depositing a transition layer over the active layer, an etching rate of the transition layer being larger than an etching rate of the active layer, the transition layer being disposed directly over a top surface of the active layer, and the transition layer being made of an insulating material;
forming a via hole in the GOA region to expose a portion of the gate metal electrode by etching off the transition layer, the active layer and the gate insulating layer
forming an opening in a thin film transistor in the display region by etching off the transition layer and a part of the active layer;
forming a source-drain metal electrode in the GOA region, and
forming a source electrode and a drain electrode in the display region, wherein the source-drain metal electrode is electrically connected to the gate metal electrode through the via hole, and the via hole is tapered from a top surface of the transition layer to a bottom surface of the active layer, and
wherein the via hole in the GOA region exposes a first sidewall of the active layer and a second sidewall of the insulating material of the transition layer, and the first sidewall is directly connected to the second sidewall.

5. The manufacturing method claimed as claim 4, wherein forming the via hole in the GOA region comprises:
forming a photoresist pattern on the transition layer and comprising a fully-removed region, a partially-retained region and a fully-retained region, wherein the fully-removed region corresponds to an area of the GOA region where the gate metal electrode is located, the partially-retained region corresponds to a thin film transistor region in the display region;

etching off the transition layer, the active layer and the gate insulating layer in the fully-removed region so as to form the via hole;

removing a first portion of the photoresist pattern in the partially-retained region and decreasing a thickness of a second portion of the photoresist pattern in the fully-retained region through a first ashing process;

etching off the transition layer and the part of the active layer in the partially-retained region; and removing the second portion of the photoresist pattern in the fully-retained region through a second ashing process.

6. The manufacturing method claimed as claim 4, after the source-drain metal electrode is formed in the GOA region and the source electrode and the drain electrode are formed in the display region, further comprising:

forming a pixel electrode electrically connected to the drain electrode and on the base substrate; and forming a protective layer on the base substrate.

7. The manufacturing method claimed as claim 6, after the protective layer is formed on the base substrate, further comprising:

forming a common electrode on the protective layer.

8. A display device, comprising:

an array substrate comprising:

a base substrate comprising a display region and a Gate driver On Array (GOA) region at a side of the display region, wherein in the display region, there is provided a thin film transistor, the thin film transistor comprising:

a gate electrode over the base substrate, a gate insulating layer over the gate electrode, an active layer over the gate insulating layer, and a source electrode and a drain electrode over the active layer;

wherein in the GOA region, there are formed:

a gate metal electrode over the base substrate and in a same first layer as the gate electrode, the gate insulating layer over the gate metal electrode, the active layer over the gate insulating layer, a transition layer over the active layer, and a source-drain metal electrode over the transition layer and in a same second layer as the source electrode and the drain electrode, wherein the transition layer is disposed directly over a top surface of the active layer, the transition layer is made of an insulating material, a via hole is provided in the GOA region and penetrating the transition layer, the active layer and the gate insulating layer to expose a portion of the gate metal electrode, the source-drain metal electrode is electrically connected to the gate metal electrode through the via hole; and the via hole is tapered from a top surface of the transition layer to a bottom surface of the active layer, and wherein the via hole in the GOA region exposes a first sidewall of the active layer and a second sidewall of the insulating material of the transition layer, and the first sidewall is directly connected to the second sidewall.

9. The manufacturing method claimed as claim 5, after the source-drain metal electrode is formed in the GOA region and the source electrode and the drain electrode are formed in the display region, further comprising:

forming a pixel electrode electrically connected to the drain electrode and on the base substrate; and forming a protective layer on the base substrate.

10. The manufacturing method claimed as claim 9, after the protective layer is formed on the base substrate, further comprising:

forming a common electrode on the protective layer.

11. The array substrate claimed as claim 2, wherein during etch of the transition layer, the gate insulating layer and the active layer, an etching rate of the transition layer is larger than an etching rate of the active layer.

12. The array substrate claimed as claim 1, wherein in the display region, the transition layer is provided between the source electrode and the active layer, and between the drain electrode and the active layer.

* * * * *